United States Patent [19]

Pops et al.

[11] 3,854,200

[45] Dec. 17, 1974

[54] INTEGRATED CIRCUIT LEAD FRAME PACKAGE

[75] Inventors: Horace Pops, Fort Wayne, Ind.; Barry C. Johnson, Pittsburgh, PA

[73] Assignee: Essex International, Inc., Fort Wayne, Ind.

[22] Filed: Mar. 5, 1973

[21] Appl. No.: 338,360

[52] U.S. Cl. .................... 29/628, 29/629, 29/630 C, 148/11.5, 174/68.5

[51] Int. Cl. ............................................ H01r 43/00

[58] Field of Search .......... 29/630 C, 577, 581, 582, 29/591, 628, 629, 630 B, 630 G; 174/DIG. 3, DIG. 5, DIG. 8, 68.5; 317/101 CC

[56] References Cited

UNITED STATES PATENTS

| | | | |
|---|---|---|---|
| 2,394,673 | 2/1946 | Edmunds | 75/157.5 |
| 3,559,285 | 2/1971 | Kauffman | 29/630 |
| 3,588,618 | 6/1971 | Otte | 317/101 CC |
| 3,747,209 | 7/1973 | Chow | 29/629 |

OTHER PUBLICATIONS

Metallugical Transactions, Vol. 1, Jan. 1970, Pops, pgs. 251–258.

*Primary Examiner*—C. W. Lanham
*Assistant Examiner*—James R. Duzan
*Attorney, Agent, or Firm*—Molinare, Allegretti, Witcoff

[57] ABSTRACT

A method for making an integrated circuit package includes the steps of fabricating lead frames from a copper-zinc-silicon beta brass alloy and soldering the leads thereof to semi-conductor chips by use of the shape memory and reverse shape memory characteristic of the alloy. The composition of the lead frame material and the choice and sequence of fabrication steps may be varied.

8 Claims, 5 Drawing Figures

PROCESSING FLOW CHART FOR INTEGRATED CIRCUIT PACKAGE

INTEGRATED CIRCUIT LEAD FRAME PACKAGE

CROSS REFERENCE TO A RELATED APPLICATION

This application is related to the application for an Improved Beta Brass Alloy and Method of Making Same, Ser. No. 107,118, filed Jan. 18, 1971. Horace Pops is a common inventor for both applications. Both applications are owned by a common assignee.

BACKGROUND OF THE INVENTION

Many techniques have been employed to produce integrated circuit packages. Beam lead, spider, flip chip and others are methods known to those skilled in the art. These known methods are expensive, not entirely reliable and require many separate and distinct processing steps.

For example, the chip and wire technique involves ultrasonic welding of a large number of extremely fine aluminum wires as leads to pads on the semiconductor chip. In the event that any one of these bonds is defective, the entire package would be rejected as a product.

It has previously been suggested by Wetmore in U.S. Pat. No. 3,243,211 that a heat activated, recoverable nonconductive plastic may be used to fasten or hold wire leads together. The heat recoverable material upon being heated will encapsulate and hold the wire leads or conductors in a fixed relative position. Such a construction would be impractical for the small components of an integrated circuit package.

It has also been suggested by Otte in U.S. Pat. No. 3,588,618 that a conductive metal with a shape memory may be used as a lead material. The lead will normally be bent to connect with a second lead at a solder connection. Upon reheating the soldered connection to melt the solder, the leads will separate due to the shape memory effect of the particular alloy utilized to make the lead. As a result, components associated with the separated leads may be easily removed for repair or the like.

So far as it is known, however, no material or process has been devised utilizing the shape memory effect or similar effects for manufacture of integrated circuit packages. This invention is directed to such a process and product.

SUMMARY OF THE INVENTION

In a principal aspect, the present invention comprises an improved method for making an integrated circuit assembly of the type which includes at least one lead attached by a conductive bond such as a solder material to at least one component. The method of the invention utilizes the so-called "shape memory effect" as well as a new effect discovered by the inventors and defined as the "reverse shape memory effect." A lead is fabricated from a chosen alloy and then strained to a first position. Subsequently, the lead is heat treated to initiate the shape memory effect and cause the lead to be positioned for bonding with the component. Alternatively, the shape memory effect may be instituted following application of strain but before positioning the lead for contact with a conductive bond. The lead is then positioned and the reverse shape memory effect is initiated to move the lead into contact with a conductive bond material.

It is thus an object of the invention to provide an improved method for making an integrated circuit assembly which, by virtue of the composition of lead material and the steps in the method, provides a simple and economical process for manufacture of an integrated circuit assembly.

It is another object of the present invention to provide a method for effecting a reverse shape memory effect in a beta brass composition.

Still another object of the present invention is to provide a method for effecting a shape memory effect in a beta brass composition in order to manufacture an integrated circuit assembly.

One further object of the present invention is to provide a method of forming an integrated circuit assembly utilizing the shape memory effect of the beta brass composition.

These and other objects, advantages and features of the invention will be set forth in the detailed discussion which follows.

BRIEF DESCRIPTION OF THE DRAWING

In the detailed description which follows, reference will be made to the drawing comprised of the following figures.

DESCRIPTION OF THE PREFERRED EMBODIMENT

Incorporated herewith by reference is the application by co-inventor Pops, Ser. No. 107,118, filed Jan. 18, 1971. This co-pending application discloses a number of typical alloys which exhibit a shape memory characteristic. The definitions of shape memory and betatizing as set forth in this co-pending application are incorporated herewith by reference also. That is, betatizing constitutes heat treatment of the alloy to provide a substantially continuous beta phase.

Figure 2:
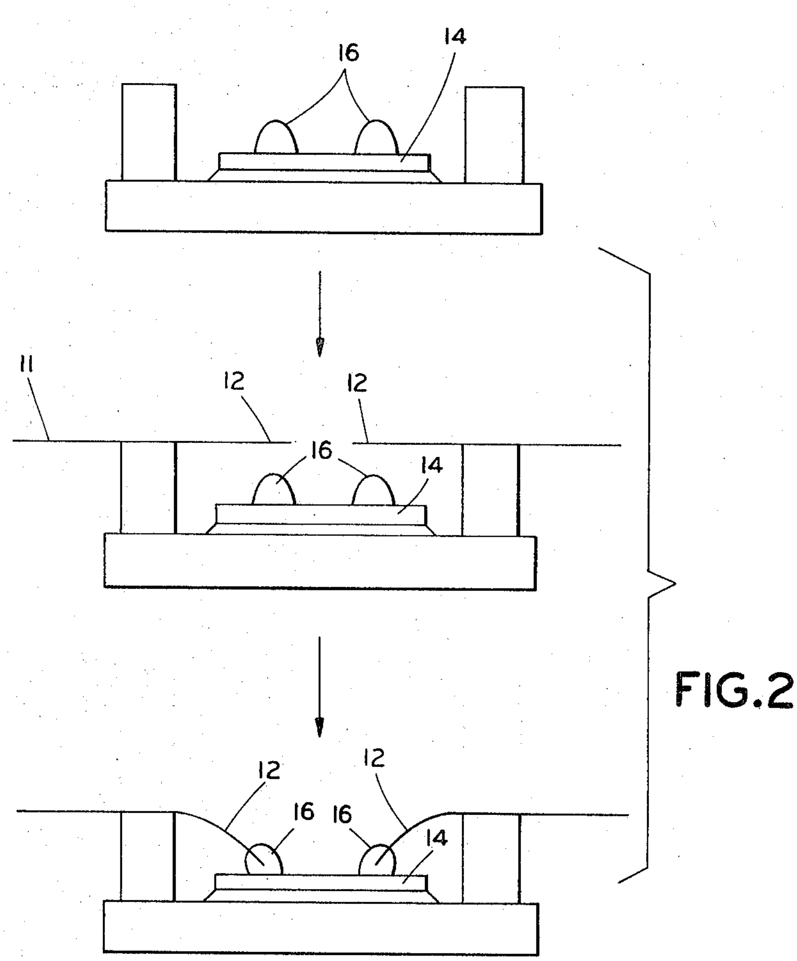
FIG. 2 is a schematic flow diagram illustrating the methods of assembly set forth in the chart in FIG. 1.
Figure 5:
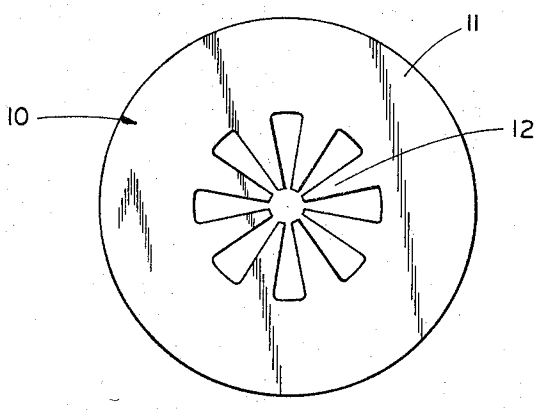
FIG. 5 is a plan view of a typical lead frame made in accordance with the invention.

Referring to FIGS. 2 and 5, a lead frame 10 is comprised of a frame member 11 and a plurality of leads or fingers 12 extending therefrom. Typically, the frame 10 is stamped or etched from a flat sheet of desired conductive metal or alloy material. The fingers 12 which extend from the frame member 11 connect to various portions or pads of a semiconductor chip 14 as illustrated schematically in FIG. 2. Thus, each of the fingers 12 is engaged by a conductive bond 16 which is, in this instance, solder, to effect an electrical connection with the chip 14.

The fingers 12 can engage the solder or bond composition 16 on the chip only if the fingers 12 move or are moved a sufficient distance out of the plane of the frame member 11 to engage and be bonded to the bond composition or molten solder 16. The movement of the fingers 12 is effected in accordance with the invention by either of two stress assisted, thermally activated processes.

The first of these processes is identified as the shape memory effect or characteristic. As a result of this effect, material which is strained at room temperature, for example, will nearly resume the original, unstrained configuration upon being heated. That is, it will move opposite to the direction of strain. Note also that the strained material is normally an alloy having a beta phase and a martensite phase and that the strain is effected at a temperature generally below the $M_s$ temperature or slightly above. This was described in some detail in the prior application cited above.

The second process is the reverse shape memory effect characteristic. This effect is not believed to have been observed or reported previously. The reverse shape memory effect provides that after being strained the material will move in the direction of the strain upon the application of heat. Movement is thus in a direction which is opposite to that due to the shape memory characteristic. Again, strained material is generally in a martensitic phase and the strain is effected at a temperature below the $M_s$ or slightly above.

It should be noted that the shape memory and reverse shape memory effects are distinct from the so-called rubber-like (pseudo-elastic or super-elastic) behavior observed in many materials. The rubber-like behavior occurs spontaneously upon release of a stress to substantially reverse the strain applied by a stress. Generally, the stress is applied above the $M_s$ temperature in order to observe "rubber-like" behavior.

Following are additional details regarding first the composition, and second, the specific steps in the method of the invention. This will be followed by specific examples of the invention.

Composition

Copper, zinc and silicon are the materials which provide an alloy that can be utilized to practice the method of the invention. Broadly, 62–64 percent by weight copper, 35–38 percent by weight zinc and 0.3–0.5 percent by weight silicon are combined to form a beta brass alloy. The specific composition utilized in most of the experimental work reported herein consists of (1) 62.19 percent by weight copper, 37.37 percent by weight zinc, and 0.44 percent by weight silicon or (2) 63.20 percent by weight copper, 36.18 percent by weight zinc and 0.46 percent by weight silicon. Both of these compositions provide a beta phase brass or mixed alpha plus beta brass at room temperature after betatization. The martensite transformation temperature of this brass is determined as reported in the previous application Ser. No. 107,118, filed Jan. 18, 1971. It is desirable to keep this transformation temperature near room temperature since the process of the invention is related, at least in part, to phase changes of the material. In the alloys discussed above, the start of the martensite transformation upon cooling occurs at temperature about −55° C ± 20° C and 13° C, respectively.

Method of the Invention

Figure 1:
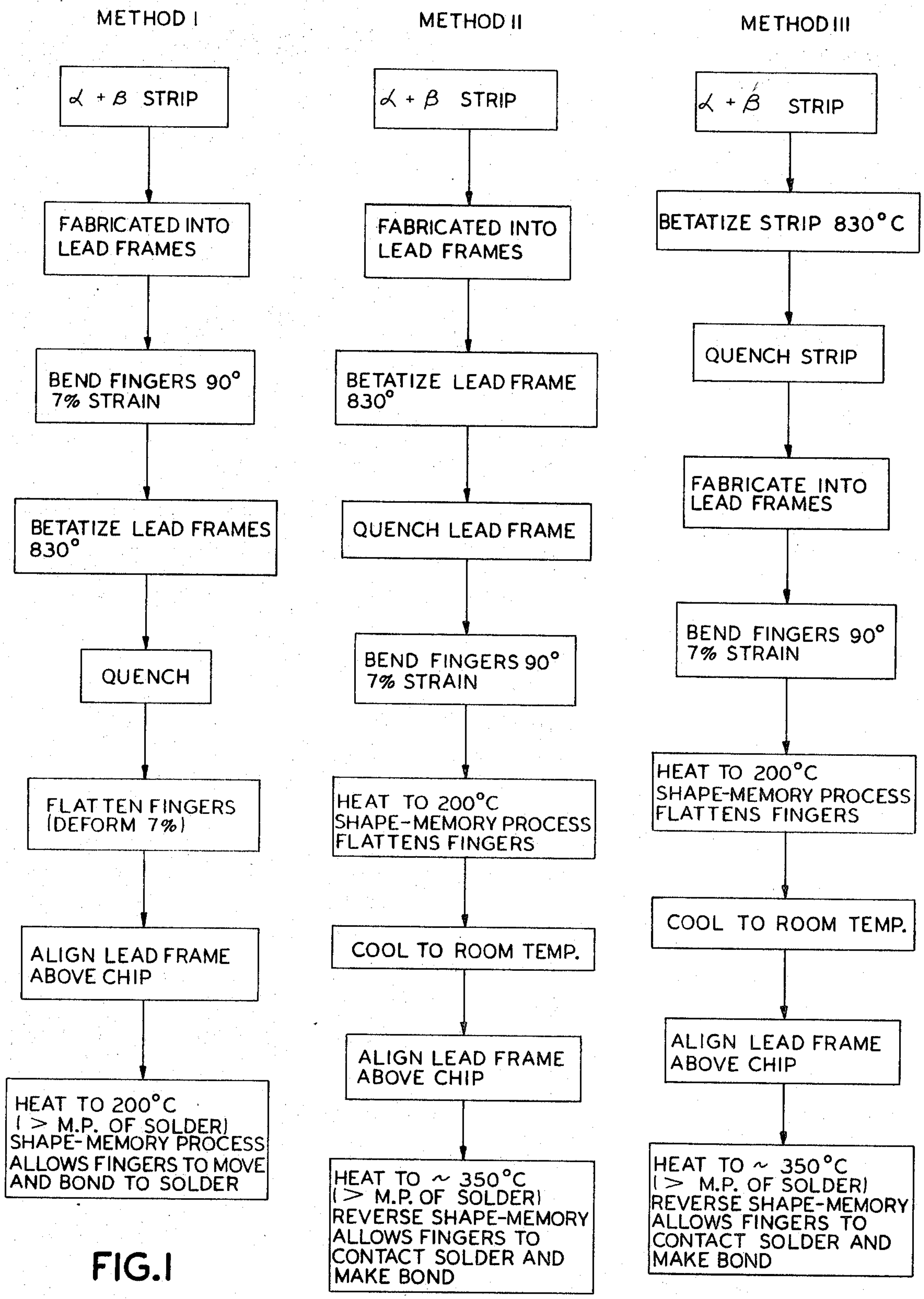
FIG. 1 is a processing flow chart of the steps for fabrication of an integrated circuit assembly in accordance with the present invention.

FIG. 1 illustrates three flow charts which show the method of the invention. All of these three methods represented by the flow chart utilize the shape memory effect of the alloy from which the lead frame is made. In addition, two of the methods utilize the reverse shape memory effect.

Figure 3:
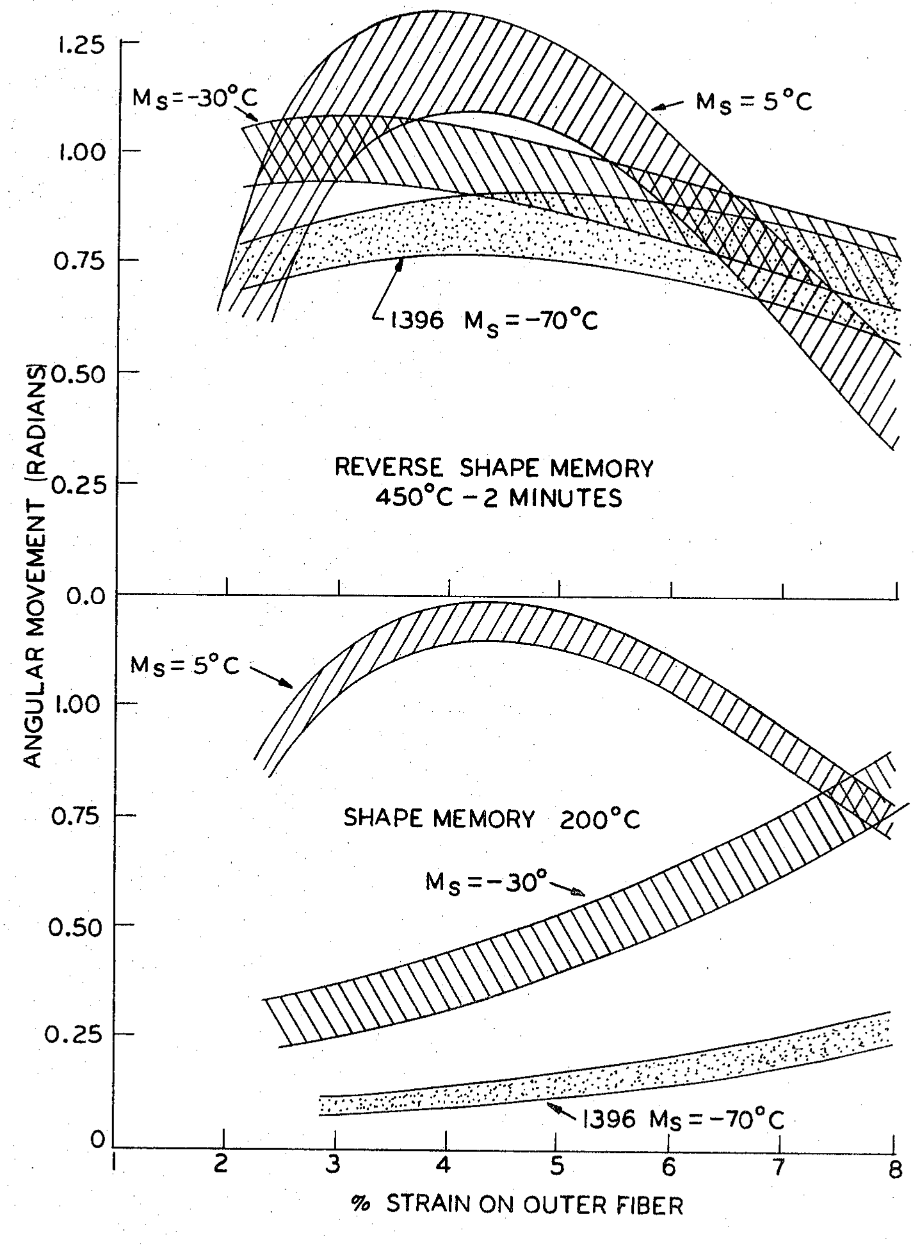
FIG. 3 is a graph of angular movement versus strain, indicating the amount of shape memory and reverse shape memory observed in a number of alloys used to practice the invention.
Figure 4:
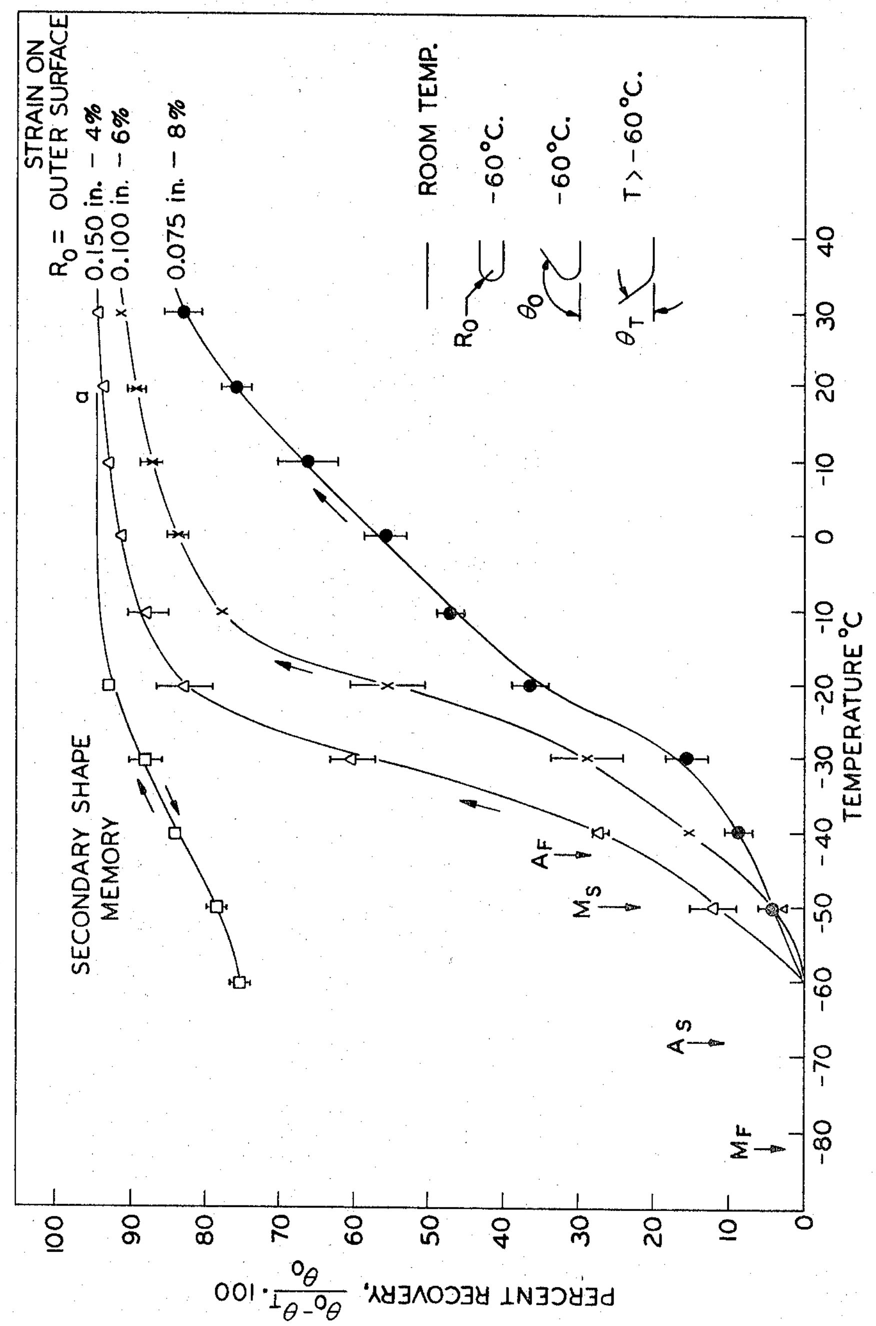
FIG. 4 is a graph illustrating the amount of strain recovery from a strain manifested by various alloys utilized to practice the invention.

To review, inducing the shape memory effect in the alloys discussed above involves deformation of the betatized alloy at a temperature below the martensite transformation temperature or slightly above. In either case, the material should contain an appreciable quantity of martensite phase. Upon heating the alloy above the martensite transformation temperature, but generally less than 400° C., the deformed alloy material will almost resume its original cnfiguration. This is illustrated in FIG. 3. The process involved is the transformation of the deformed martensite phase into the beta phase.

To initiate the reverse shape memory effect, deformation of the martensite phase when the alloy is below the transformation temperature is necessary. In addition, the material may also be deformed at temperatures slightly above the martensite transformation temperature. Following deformation, the material is heated to a higher temperature range than that employed to initiate the normal shape memory effect. Typically, this range is between 230° C. and 550° C. for the alloys tested. The process occurs isothermally, thereby requiring that the alloy be held at temperature for a minimum time. As a result of the reverse shape memory effect, the material moves in the direction of original strain.

The process involves decomposition of the deformed material into a bainitic phase. Relative movement of the alloy occurs during the transformation into the bainitic type phase in accordance with FIG. 3. In contrast to the shape memory effect, movement during the reverse shape memory effect takes place in the direction of original deformation.

For example, if a typical beta brass alloy of the type defined above is strained on the order of 10 percent at 25° C., it exhibits a 32 percent shape recovery at 200° C. It moves 32 percent toward its original position or away from the direction of bending upon heating to 200° C. The same material also exhibits a 45 percent movement toward the direction of bending or deformation upon continued heating for 1 second at 450° C. This continued movement toward the direction of deformation constitutes the reverse shape memory effect.

Examples

Method I

A ternary brass alloy composition of 63.2 percent copper, 36.1 percent zinc and 0.46 percent silicon was processed to 6 mil strip by conventional melting and rolling methods. In this form, it consists of a duplex mixture of $\alpha$ and $\beta$ phases. Lead frames of the design shown in FIG. 5 were photo-chemically etched (fabrication by stamping or any other method is permissible) from the $\alpha+\beta$ material. The lead frame fingers 12 were bent 90° about a mandrel having a .040 inch bend radius (corresponding to a 7 percent strain on the outer fiber). Each of the lead frames was betatized by heating to 830° C. (any temperature in the $\beta$ phase field is permissible, namely 800° > 850° C.) for 5 minutes, and quenched into water to retain the high temperature $\beta$ phase.

Deformation of the martensite phase is accomplished by flattening the lead frames at ambient temperature. The lead frames are now positioned above the semiconductor chips 14 and heated to a temperature of 200° C. Shape-memory occurs during heating, causing each of the fingers to move simultaneously into the molten solder 16.

Method II

The $\alpha + \beta$ alloy strip is fabricated into lead frames by photochemical etching. They are betatized and quenched in an identical manner as described above. The same amount of bending (7 percent strain) is used on the fingers 12 but in this case, it is applied to a $\beta$ phase material or martensite, if the Ms temperature is above room temperature. Heating to 200° C. produces shape-memory and tends to flatten the fingers. After cooling to room temperature, the (nearly) flat lead frames are positioned above the solder bumps, and the package is placed in a furnace at 450° C. Since "reverse-shape memory" occurs (within 2 minutes) the deformed fingers move in the direction of bending and hence, make contact with the molten solder 16. A minimum movement of 10 mils in the vertical direction is required; this is possible to achieve with the copper-zinc-silicon alloys.

Method III

Alternatively, Method III may be employed and, in fact, is the preferred procedure since betatization is accomplished continuously with minimum distortion. A description of the continuous fabrication technique is contained in the previous patent application Ser. No. 107,118. A strip of $\alpha + \beta$ is heated to its betatization temperature (830° C.), discharged from the furnace, and immediately quenched by cold steel rolls or any other metallic conductor, and a coolant spray. Lead frames are fabricated from the heat treated strip, as described in Methods I and II. Bending of the fingers 90° (7 percent strain on the other fiber) is subsequently performed at room temperature.

Flattening occurs by a shape-memory process, and is produced by heating the deformed lead frames to 200° C. Following alignment above the chip, the package is placed in an oven for 2 minutes at 450° C. This final step simultaneously produces reverse-shape memory, movement of the fingers in a downward direction, and bonding of the lead frame to the chip.

Note that in each of the examples, the materials are polycrystalline, wrought or worked materials. That is, the product and process of the present invention is possible because the alloys chosen exhibit the reverse shape memory and shape memory characteristics when in a polycrystalline, worked condition. These phenomena are not generally observed in such worked materials and therefore the product and process of the present invention is considered unexpected.

While in the foregoing there has been set forth a preferred number of embodiments of the invention, it is to be understood that the invention shall be limited only by the following claims and their equivalents. That is, other materials exhibit the shape memory characteristic. Consequently, the methods of the present invention may be utilized to practice the invention.

What is claimed is:

1. A method for making an integrated circuit assembly of the type including at least one lead attached to at least one component by a conductive bond connection comprising the steps of:

fabricating said lead from a material having a shape memory characteristic;

straining said lead to a first position;

placing said lead in a position for eventual contact with a conductive bond; and heat treating said lead to effect said shape memory, thereby reversing the strain and permitting said lead to engage the conductive bond and be retained by said bond after the heat treatment.

2. The improved method of claim 1 wherein said material is a brass composition of about 62–65 percent by weight copper, 35–38 percent by weight zinc and 0.3–0.5 percent by weight silicon, said material being formed as a strip comprised of alpha plus beta phases, and wherein said fabrication step comprises forming said strip into a lead, deforming said lead up to 10 percent, betatizing said lead, and quenching said lead.

3. The improved method of claim 1 wherein said material is a composition which provides a shape memory characteristic from a few degrees Centigrade below the martensite transformation temperature to about 400° C.

4. A method for making an integrated circuit assembly of the type including at least one lead attached by a conductive bond to at least one component comprising the steps of:

fabricating said lead from a material having both a shape memory and a reverse shape memory characteristic;

straining said lead to a first contact position;

heat treating said lead to effect the shape memory characteristic;

placing said lead in a position for eventual contact with said conductive bond; and heat treating said lead to effect the reverse shape memory characteristic, thereby engaging said lead with said conductive bond.

5. The method of claim 4 wherein fabricating said lead comprises fabrication of a brass composition of about 62–65 percent by weight copper, 35–38 percent by weight zinc and 0.3–0.5 percent by weight silicon.

6. The method of claim 4 wherein fabricating said lead comprises the step of forming a lead from a brass composition of about 62–65 percent by weight copper, 35–38 percent by weight zinc and 0.3–0.5 percent by weight silicon and subsequently betatizing said material.

7. The method of claim 4 wherein fabricating said lead comprises fabrication of said material into a lead frame followed by subsequent betatization of said lead frame.

8. The method of claim 4 wherein fabricating said lead comprises betatizing a strip of said material followed by fabrication of a lead frame from the betatized strip.

* * * * *